United States Patent
Hsieh et al.

(10) Patent No.: US 12,342,647 B2
(45) Date of Patent: Jun. 24, 2025

(54) SEMICONDUCTOR ARRANGEMENT AND METHOD OF MAKING

(71) Applicant: TAIWAN SEMICONDUCTOR MANUFACTURING COMPANY LIMITED, Hsin-Chu (TW)

(72) Inventors: Feng-Chien Hsieh, Pingtung (TW); Yun-Wei Cheng, Taipei (TW); Kuo-Cheng Lee, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 555 days.

(21) Appl. No.: 17/181,499

(22) Filed: Feb. 22, 2021

(65) Prior Publication Data

US 2022/0271079 A1   Aug. 25, 2022

(51) Int. Cl.
*H10F 39/00* (2025.01)
(52) U.S. Cl.
CPC ......... *H10F 39/806* (2025.01); *H10F 39/024* (2025.01)
(58) Field of Classification Search
CPC ......... H01L 27/14625; H01L 27/14685; H01L 27/146; H01L 27/1463; H10F 39/806; H10F 39/024; H10F 39/8063; H10F 39/014; H10F 39/18; H10F 39/199
See application file for complete search history.

(56) References Cited

U.S. PATENT DOCUMENTS

| | | | |
|---|---|---|---|
| 10,553,733 B2 * | 2/2020 | Huang | H01L 27/1464 |
| 11,362,124 B2 * | 6/2022 | Bonakdar | H01L 27/14603 |
| 2018/0151759 A1 * | 5/2018 | Huang | H10K 39/32 |
| 2019/0096930 A1 * | 3/2019 | Chuang | H01L 27/1461 |
| 2019/0148434 A1 * | 5/2019 | Hsu | H01L 27/14629 |
| | | | 257/432 |
| 2021/0242264 A1 * | 8/2021 | Bonakdar | H01L 27/14645 |
| 2022/0223637 A1 * | 7/2022 | Takeda | H01L 27/14627 |

* cited by examiner

*Primary Examiner* — Dao H Nguyen
(74) *Attorney, Agent, or Firm* — Cooper Legal Group, LLC

(57) ABSTRACT

A semiconductor arrangement is provided. The semiconductor arrangement includes a first photodiode in a substrate. The semiconductor arrangement includes a lens array over the substrate. A first plurality of lenses of the lens array overlies the first photodiode. Radiation incident upon the first plurality of lenses is directed by the first plurality of lenses to the first photodiode.

20 Claims, 8 Drawing Sheets

SEMICONDUCTOR ARRANGEMENT AND METHOD OF MAKING

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
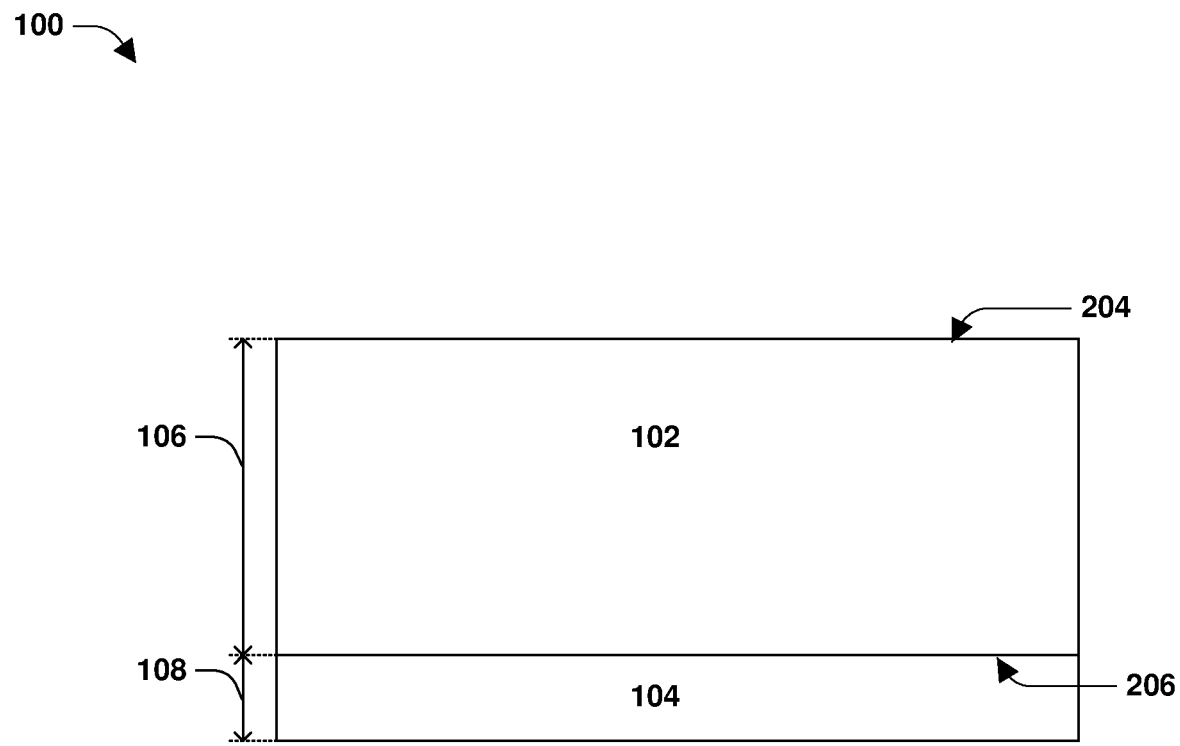
FIGS. 1-5 illustrate cross-sectional views of a semiconductor arrangement at various stages of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

A semiconductor arrangement has a first component, such as a first photodiode, in a substrate, and a lens array over the substrate. A first plurality of lenses of the lens array overlies the first component. Each lens of the first plurality of lenses at least one of refracts radiation, directs the radiation towards the first component, or focuses and concentrates the radiation onto the first component. The first plurality of lenses thereby increase an amount of radiation that is at least one of sensed, detected, or converted to electrons by the first component, as compared to semiconductor arrangements having merely a single lens over the first component.

The semiconductor arrangement includes a dielectric layer between the lens array and the substrate. A first portion of the dielectric layer has a tapered sidewall and overlies the first component. The first portion of the dielectric layer has a higher absorption of radiation as compared to a dielectric layer not having a tapered sidewall, and thereby directs more radiation to the first component. In some embodiments, the first portion of the dielectric layer is a first high absorption (HA) structure. A dielectric layer not having a tapered sidewall is not a HA structure and scatters or reflects more radiation away from the first component as compared to the first portion of the dielectric layer having the tapered sidewall. In some embodiments, a first lens of the first plurality of lenses overlies the first HA structure and a second lens of the first plurality of lenses overlies a second HA structure. Implementing HA structures in conjunction with a plurality of lenses over the first component further increases an amount of radiation that is at least one of sensed, detected, or converted to electrons by the first component.

A second portion of the dielectric layer is between or laterally offset from the first component and a second component, such as a second photodiode, in the substrate. The second portion of the dielectric layer corresponds to a deep trench isolation (DTI) feature. In some embodiments, the semiconductor arrangement is formed in the backside of the substrate such that the second portion of the dielectric layer corresponds to a backside DTI (BDTI) feature. The second portion of the dielectric layer inhibits radiation directed toward the first component, such as by at least one of the first plurality of lenses, the first HA structure or the second HA structure, from travelling to the second component, and thereby at least one of inhibits cross talk between the first component and the second component or enhances a modulation transfer function (MTF), where a higher MTF provides for, among other things, improved resolution of an image generated based upon light detected by photodiodes in the substrate.

Implementing at least one of the first plurality of lenses overlying the first component, the first HA structure overlying the first component, the second HA structure overlying the first component, or the second portion of the dielectric layer that is laterally offset from the first component in the substrate, provides for an increased quantum efficiency (QE) as compared with semiconductor arrangements not having at least one of the first plurality of lenses, the first HA structure, the second HA structure, or the second portion of the dielectric layer. In some embodiments, the semiconductor arrangement operates as a sensor, such as at least one of an image sensor, a proximity sensor, or a different type of sensor. Given the increased QE, the semiconductor arrangement operates more efficiently than other sensors, such as requiring less power, detecting more light in relatively low light environments, etc.

FIGS. 1-12 illustrate a semiconductor arrangement 100 at various stages of fabrication, in accordance with some embodiments. FIGS. 1, 2, 3, 4, 5, 8, 9, 10, and 11 illustrate cross-sectional views of the semiconductor arrangement 100. FIGS. 6A, 7A, and 12A illustrate top views of the semiconductor arrangement 100, and FIGS. 6B, 7B, and 12B illustrate cross-sectional views of the semiconductor arrangement 100 taken along lines B-B of FIGS. 6A, 7A, and 12A, respectively.

In some embodiments, a sensor is implemented via the semiconductor arrangement 100. The sensor comprises at least one of an image sensor, a proximity sensor, a time of flight (ToF) sensor, an indirect ToF (iToF) sensor, a backside illumination (BSI) sensor, a complementary metal-oxide-semiconductor (CMOS) image sensor, a backside CMOS image sensor, or another type of sensor. Other structures and/or configurations of the semiconductor arrangement 100 and/or the sensor are within the scope of the present disclosure.

FIG. 1 illustrates the semiconductor arrangement 100 according to some embodiments. The semiconductor arrangement 100 comprises a substrate 102 and a first dielectric layer 104. The substrate 102 has a first side 204 and a second side 206, where the first side 204 corresponds to a back side of the substrate 102 and the second side 206 corresponds to a front side of the substrate 102. According to some embodiments, the first dielectric layer 104 is formed over the second side 206 of the substrate 102 and the arrangement is inverted to the orientation illustrated in FIG. 1. As illustrated in FIG. 1, a top surface of the substrate 102 corresponds to the back or first side 204, and a bottom surface of the substrate 102 corresponds to the front or second side 206. The substrate 102 at least one of overlies the first dielectric layer 104, is in direct contact with the first dielectric layer 104, or is in indirect contact with the first dielectric layer 104.

The substrate 102 comprises at least one of an epitaxial layer, a silicon-on-insulator (SOI) structure, a wafer, or a die formed from a wafer. The substrate 102 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. The substrate 102 comprises at least one of monocrystalline silicon, crystalline silicon with a <100> crystallographic orientation, crystalline silicon with a <110> crystallographic orientation, crystalline silicon with a <111> crystallographic orientation or other suitable material. The substrate 102 has at least one doped region. The substrate 102 has a thickness 106 between about 10,000 angstroms to about 150,000 angstroms (such as between about 20,000 angstroms to about 100,000 angstroms). Other structures and/or configurations of the substrate 102 are within the scope of the present disclosure.

The first dielectric layer 104 comprises at least one of $Si_3N_4$, $SiO_2$, SiO, MgO, $Al_2O_3$, $Yb_2O_3$, ZnO, $Ta_2O_5$, $ZrO_2$, $HfO_2$, $TeO_2$, $TiO_2$, or other suitable material. The first dielectric layer 104 is at least one of an interlevel dielectric (ILD) or an intermetal dielectric (IMD). The first dielectric layer 104 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. The first dielectric layer 104 has a thickness 108 between about 5,000 angstroms to about 15,000 angstroms (such as about 10,000 angstroms). Other structures and/or configurations of the first dielectric layer 104 are within the scope of the present disclosure.

Figure 2:
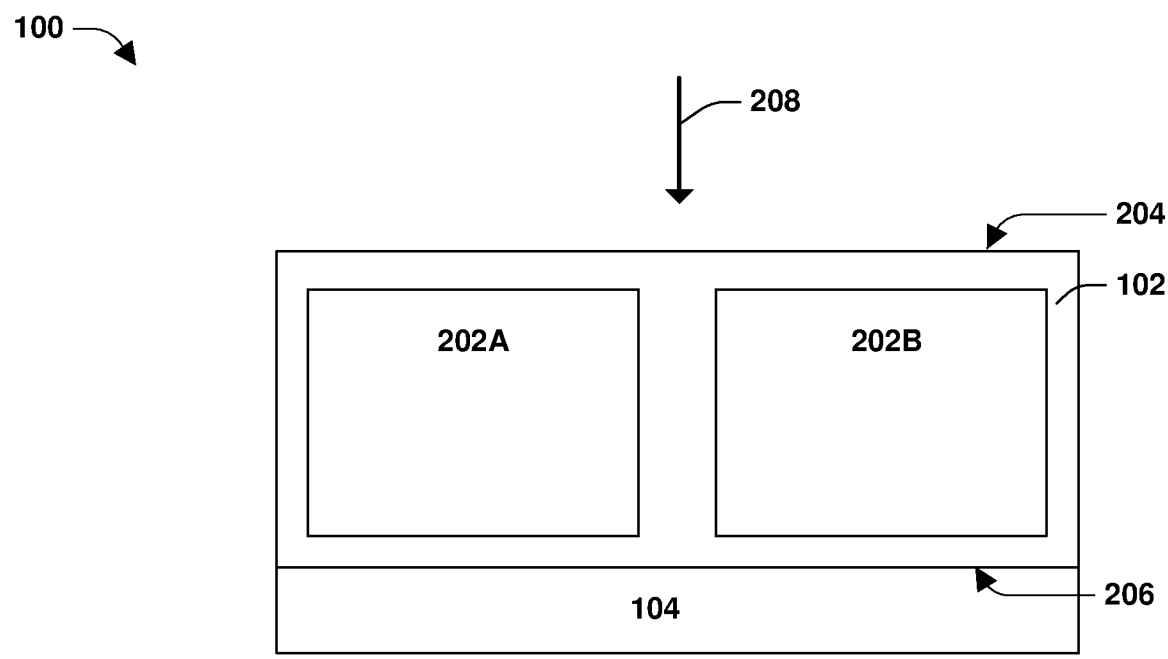

FIG. 2 illustrates components 202 formed in the substrate 102, according to some embodiments. The components 202 are formed by at least one of doping, ion implantation, molecular diffusion, or other suitable techniques. In some embodiments, the components 202 comprise photodiodes, such as at least one of pinned layer photodiodes, phototransistors, photogates, or other suitable components. At least some of the components 202 can vary from one another to have at least one of different heights, thicknesses, widths, material compositions, etc. The components 202 comprise at least one of a first component 202A or a second component 202B. Any number of components 202 in the substrate 102 are contemplated.

At least some of the components 202 comprise at least one of germanium, indium, phosphorous, boron, $BF_2$, arsenic, antimony, fluorine, InAs, InSb, GaSb, GaAs, InP, a silicide, or other suitable material. The components 202 are configured to sense radiation, such as incident light, which is projected towards the substrate 102 along direction 208. At least some of the components 202 can comprise a material that is relatively highly absorptive to NIR wavelengths, such as radiation having a wavelength between about 700 nanometers to about 2500 nanometers. Other structures and/or configurations of the components 202 are within the scope of the present disclosure.

Figure 3:
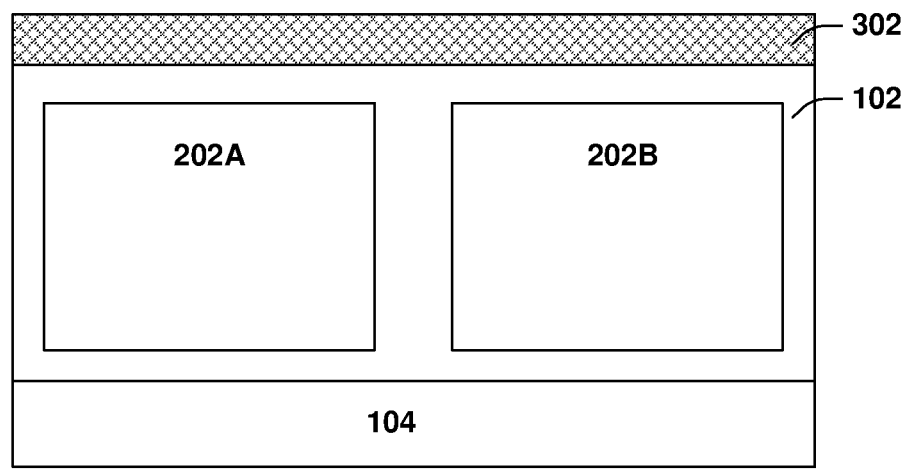

FIG. 3 illustrates a mask layer 302 formed over the substrate 102, according to some embodiments. The mask layer 302 at least one of overlies the substrate 102, is in direct contact with the substrate 102, or is in indirect contact with the substrate 102. In some embodiments, the mask layer 302 is a hard mask layer. The mask layer 302 comprises at least one of oxide, nitride, a metal, or other suitable material. The mask layer 302 is formed by at least one of PVD, sputtering, CVD, LPCVD, ALCVD, UHVCVD, RPCVD, ALD, MBE, LPE, spin on, growth, or other suitable techniques. Other structures and/or configurations of mask layer 302 are within the scope of the present disclosure.

Figure 4:
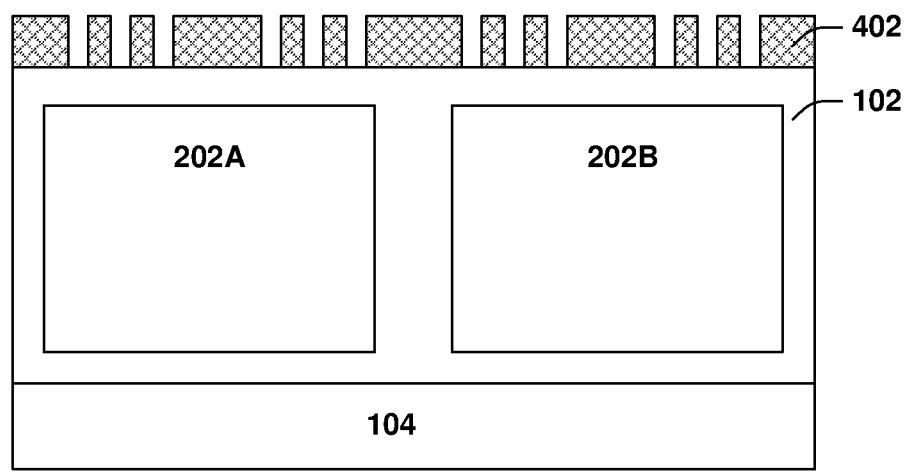

FIG. 4 illustrates the mask layer 302 patterned to form a patterned mask layer 402 over the substrate 102, according to some embodiments. According to some embodiments, a photoresist (not shown) is used to form the patterned mask layer 402. The photoresist is formed over the mask layer 302 by at least one of PVD, sputtering, CVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer.

An etching process used to remove portions of the mask layer 302 to form the patterned mask layer 402 is at least one of a dry etching process, a wet etching process, an anisotropic etching process, an isotropic etching process or another suitable etching process. The etching process uses at least one of HF, diluted HF, $HCl_2$, $H_2S$, or other suitable material. In some embodiments, the etching process performed to remove portions of the mask layer 302 and form the patterned mask layer 402 also removes at least some of the substrate 102, such as portions of the substrate 102 underlying openings in the patterned mask layer 402. Other processes and/or techniques for forming the patterned mask layer 402 are within the scope of the present disclosure.

Figure 5:
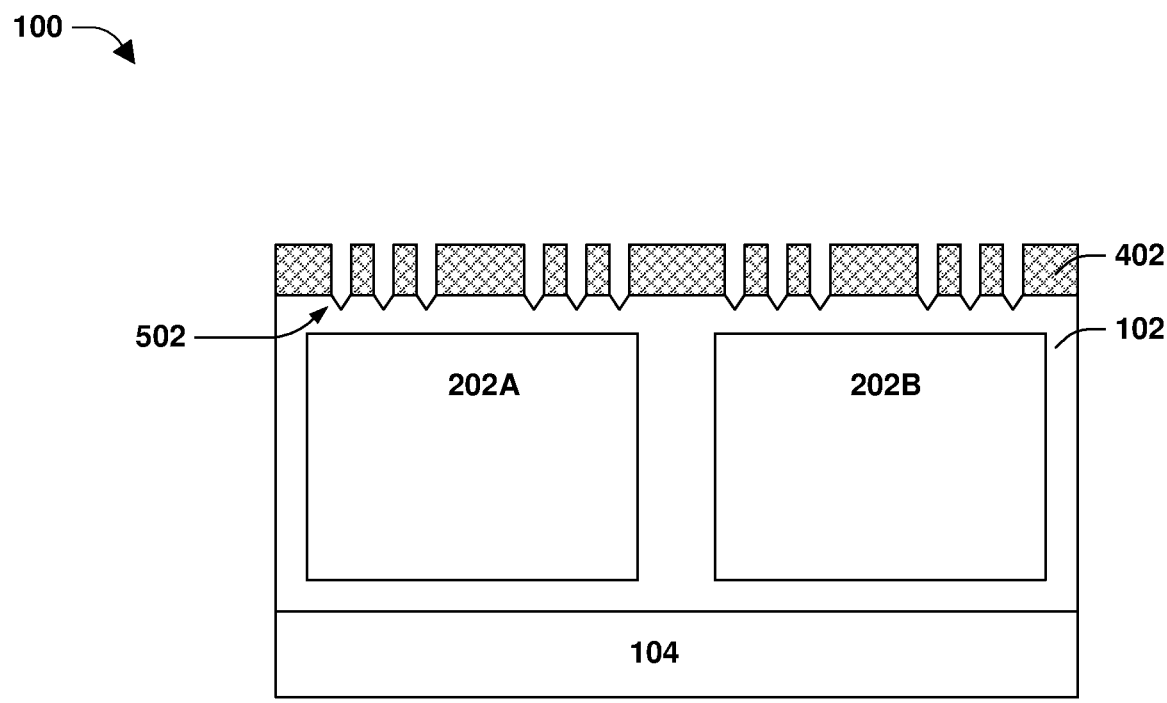

FIG. 5 illustrates use of the patterned mask layer 402 to form recesses 502 in the substrate 102, according to some embodiments. In some embodiments, an etching process is performed to form the recesses 502, where openings in the patterned mask layer 402 allow one or more etchants applied during the etching process to remove portions of the substrate 102 while the patterned mask layer 402 protects or shields portions of the substrate 102 that are covered by the patterned mask layer 402. The etching process is at least one of a dry etching process, a wet etching process, an anisotropic etching process, an isotropic etching process, or another suitable etching process. The etching process uses at least one of HF, diluted HF, a chlorine compound such as $HCl_2$, $H_2S$ or other suitable material. Other processes and/or techniques for forming the recesses 502 are within the scope of the present disclosure.

One or more recesses 502 overlie a component 202. Any number of recesses 502 over a component 202 are contemplated. A portion of the substrate 102 remains over the component 202 to separate the recess 502 from the component 202. Other structures and/or configurations of the recesses 502 are within the scope of the present disclosure.

Figure 6A:
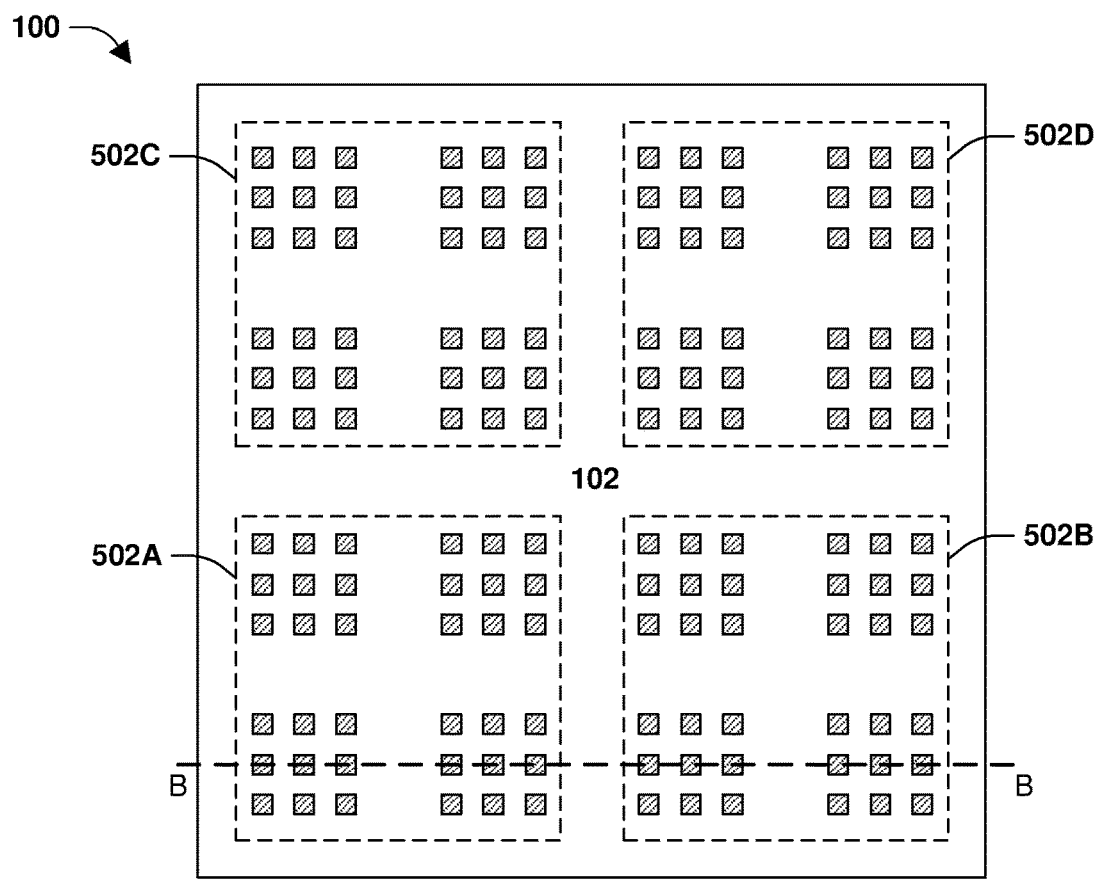
FIG. 6A illustrates a top view of a semiconductor arrangement at a stage of fabrication, in accordance with some embodiments.
Figure 6B:
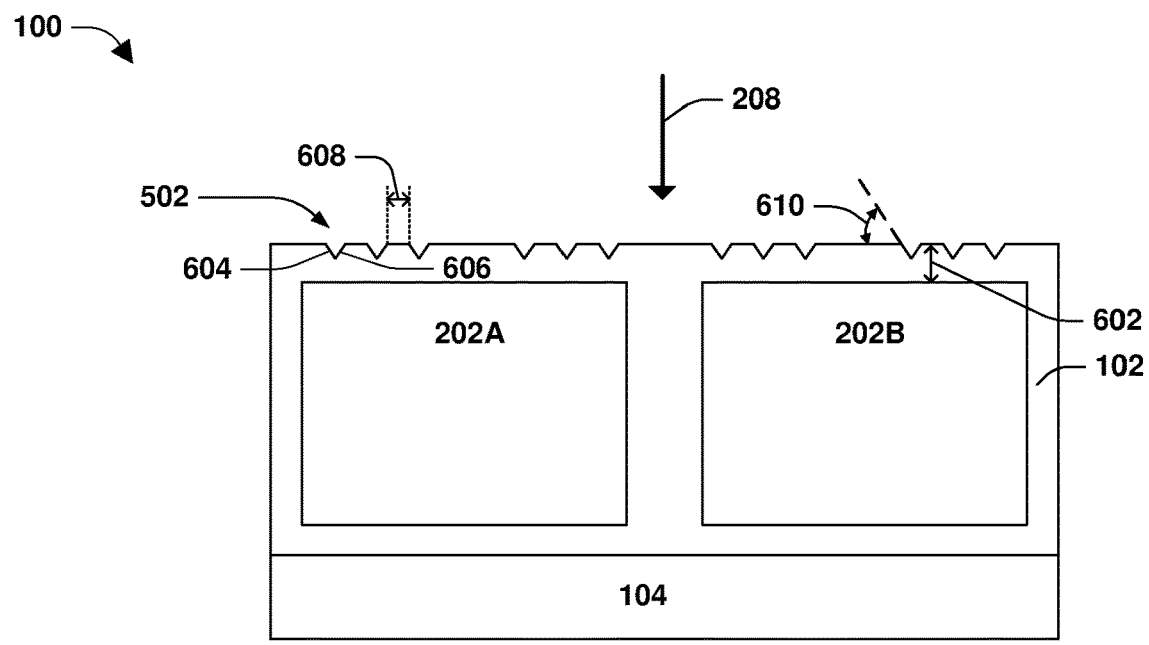
FIG. 6B illustrates a cross-sectional view a semiconductor arrangement taken along line B-B of FIG. 6A, in accordance with some embodiments.

FIGS. 6A and 6B illustrate removal of the patterned mask layer 402, according to some embodiments. The patterned mask layer 402 is removed after the recesses 502 are formed. The patterned mask layer 402 is removed by at least one of CMP, etching, or other suitable techniques. The etching process is at least one of a dry etching process, a wet etching process, an anisotropic etching process, an isotropic etching process, or another suitable etching process. The etching process uses at least one of HF, diluted HF, a chlorine compound such as $HCl_2$, $H_2S$, or other suitable material. Other processes and/or techniques for removing the patterned mask layer 402 are within the scope of the present disclosure.

A portion of the substrate 102 defining a recess 502 has at least one of a first tapered sidewall 604 (shown in FIG. 6B) or a second tapered sidewall 606 (shown in FIG. 6B). At least one of the first tapered sidewall 604 has a first slope, such as a negative slope, or the second tapered sidewall 606 has a second slope, such as a positive slope. In some embodiments, the second slope is opposite in polarity relative to the first slope. In some embodiments, a recess 502 has a triangular shape. In some embodiments, a cross-sectional area of a recess 502 decreases along the direction 208, such that a width of an upper portion of the recess 502 is greater than a width of a lower portion of the recess 502. Other structures and/or configurations of the recesses 502 are within the scope of the present disclosure. In some embodiments, an angle 610 (shown in FIG. 6B), at which a sidewall defining a recess 502 is tapered, with respect to the top surface of the substrate 102 is between about 30 degrees to about 80 degrees (such as about 54.74 degrees).

In some embodiments, the substrate 102 having a specific crystallographic orientation, such as crystalline silicon with at least one of a <100> crystallographic orientation, a <110> crystallographic orientation, or a <111> crystallographic orientation, enables an etching process to form the sidewalls 604, 606. In some embodiments, portions of the substrate 102 have different crystallographic orientations, such as at least one of a <100> crystallographic orientation, a <110> crystallographic orientation, or a <111> crystallographic orientation, where etch rates of the etching process differ between the different crystallographic orientations at least due to different densities of the different crystallographic orientations, resulting in the sidewalls 604, 606 being formed by the etching process.

In some embodiments, a first portion of the substrate 102 having the first tapered sidewall 604 and the second tapered sidewall 606 has a first crystallographic orientation such as <111> crystallographic orientation, and a second portion of the substrate 102 that is removed to form the recess 502 has a second crystallographic orientation such as <100> crystallographic orientation. In some embodiments, a density, such as a surface density, of the first crystallographic orientation is greater than a density, such as a surface density, of the second crystallographic orientation, such that the etching process removes the second portion of the substrate 102 while removing little to none of the first portion of the substrate 102 due to an etch rate of the second portion of the substrate 102 being higher than an etch rate of the first portion of the substrate 102. Other processes and/or techniques for forming the sidewalls defining the recesses 502 are within the scope of the present disclosure.

A distance 602 (shown in FIG. 6B) between a top surface of a component 202 and at least one of an uppermost portion of the recess 502 or the top surface of the substrate 102 is less than or equal to about 20,000 angstroms (such as less than or equal to about 10,000 angstroms). A distance 608 (shown in FIG. 6B) between two adjacent recesses 502 is between about zero angstroms to about 50,000 angstroms. Other structures and/or configurations of a recess 502 relative to other elements, features, etc. are within the scope of the present disclosure.

The recesses 502 comprise at least one of a first plurality of recesses 502A (shown in FIG. 6A), a second plurality of recesses 502B (shown in FIG. 6A), a third plurality of recesses 502C (shown in FIG. 6A), or a fourth plurality of recesses 502D (shown in FIG. 6A). The first plurality of recesses 502A overlies the first component 202A, the second plurality of recesses 502B overlies the second component 202B, the third plurality of recesses 502C overlies a third component 202 (not shown), and the fourth plurality of recesses 502D overlies a fourth component 202 (not shown). Other structures and/or configurations of a plurality of recesses 502 relative to other elements, features, etc. are within the scope of the present disclosure.

Figure 7A:
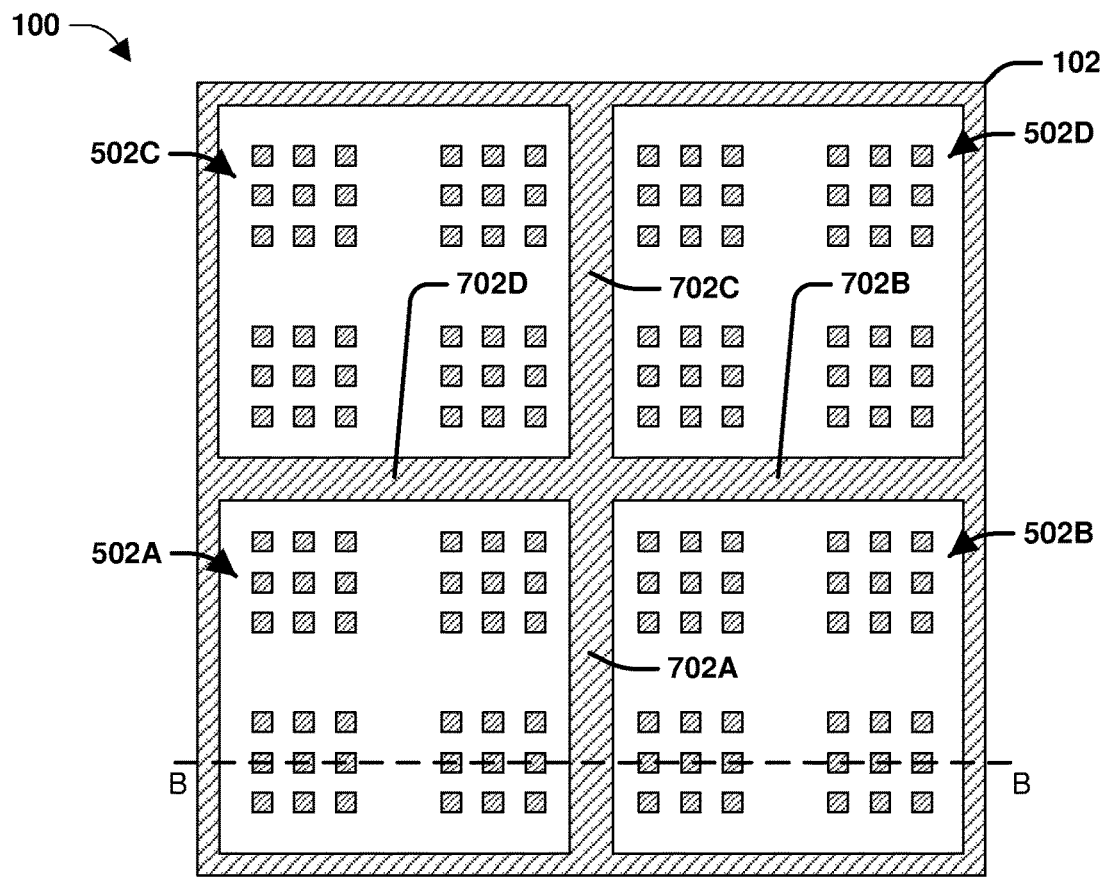
FIG. 7A illustrates a top view of a semiconductor arrangement at a stage of fabrication, in accordance with some embodiments.
Figure 7B:
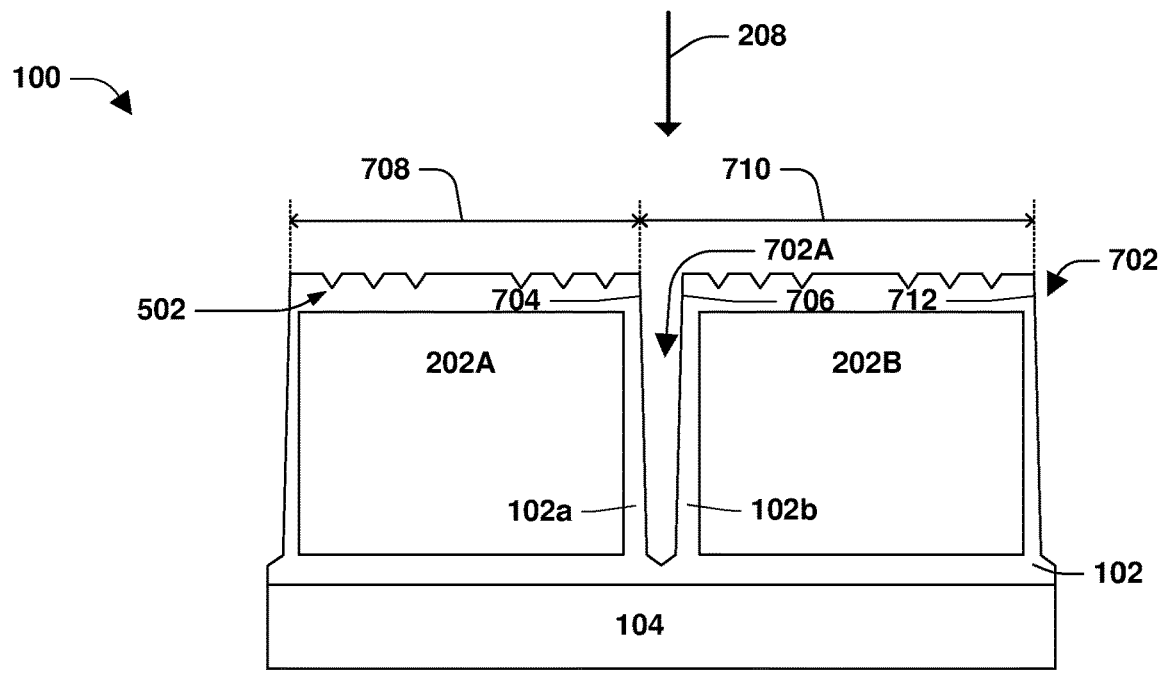
FIG. 7B illustrates a cross-sectional view a semiconductor arrangement taken along line B-B of FIG. 7A, in accordance with some embodiments.

FIGS. 7A and 7B illustrates trenches 702 formed in the substrate 102, according to some embodiments. The trenches 702 are at least one of laterally offset from a component 202 or between two components 202. A first portion 102a(shown in FIG. 7B) of the substrate 102 separates the trench 702 from the first component 202A and a second portion 102b (shown in FIG. 7B) of the substrate 102 separates the trench 702 from the second component 202B.

In some embodiments, the trenches 702 are formed using a photoresist (not shown) that is formed and patterned over the substrate 102. The photoresist is formed by at least one of PVD, sputtering, CVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist and is patterned as previously described.

One or more etchants are used in conjunction with the patterned photoresist to form the trenches 702. The one or more etchants have a selectivity such that the one or more etchants remove or etch away one or more layers exposed or not covered by the photoresist at a greater rate than the one or more etchants remove or etch away the photoresist. An opening in the photoresist allows the one or more etchants to form a trench 702 in the substrate 102, and thereby transfer a pattern in the photoresist to the one or more layers under the photoresist. The photoresist is removed after the pattern transfer, such as at least one of stripped or washed away. An etching process used to form the trenches 702 is at least one of a dry etching process, a wet etching process, an anisotropic etching process, an isotropic etching process, or another suitable etching process. The etching process uses at least one of HF, diluted HF, a chlorine compound such as HCl2, H2S, or other suitable material. Other processes and/or techniques for forming the trenches 702 are within the scope of the present disclosure.

A portion of the substrate 102 defining a first trench 702A has a first sidewall 704 (shown in FIG. 7B) and a second sidewall 706 (shown in FIG. 7B). At least some of the first sidewall 704 is tapered and/or at least some of the second sidewall 706 is tapered. The first sidewall 704 has a first slope, such as a negative slope, and/or the second sidewall 706 has a second slope, such as a positive slope. In some embodiments, the second slope is opposite in polarity relative to the first slope. In some embodiments, a cross-sectional area of a trench 702 decreases along the direction 208, such that a width of an upper portion of the trench 702 is greater than a width of a lower portion of the trench 702.

In some embodiments, the substrate 102 having a specific crystallographic orientation, such as crystalline silicon with at least one of a <100> crystallographic orientation, a <110> crystallographic orientation, or a <111> crystallographic orientation, enables an etching process to form the sidewalls 704, 706. In some embodiments, portions of the substrate 102 have different crystallographic orientations, such as at least one of a <100> crystallographic orientation, a <110> crystallographic orientation, or a <111> crystallographic orientation, where etch rates of the etching process differ between the different crystallographic orientations at least due to different densities of the different crystallographic orientations, resulting in the sidewalls 704, 706 being formed by the etching process.

In some embodiments, a first portion of the substrate 102 having the first sidewall 704 and the second sidewall 706 has a first crystallographic orientation such as <111> crystallographic orientation, and a second portion of the substrate 102 that is removed to form the first trench 702A has a second crystallographic orientation such as <100> crystallographic orientation. In some embodiments, a density, such as a surface density, of the first crystallographic orientation is greater than a density, such as a surface density, of the second crystallographic orientation, such that the etching process removes the second portion of the substrate 102 while removing little to none of the first portion of the substrate 102 due to an etch rate of the second portion of the substrate 102 being higher than an etch rate of the first portion of the substrate 102. Other processes and/or techniques for forming the sidewalls defining the trenches 702 are within the scope of the present disclosure.

According to some embodiments, at least some of a sidewall defining a trench 702, such as at least some of the first sidewall 704 and/or at least some of the second sidewall 706, extend vertically, such as in a direction parallel to the direction 208. Other structures and/or configurations of the trenches 702 are within the scope of the present disclosure.

In some embodiments, a distance 708 (shown in FIG. 7B) between two adjacent trenches 702 is between about 10,000 angstroms to about 120,000 angstroms (such as about 92,400 angstroms). In some embodiments, a distance 710 (shown in FIG. 7B) between an uppermost portion of the first sidewall 704 of the first trench 702A and an uppermost portion of a sidewall 712 of an adjacent trench 702 is between about 10,200 angstroms to about 130,000 angstroms (such as about 95,000 angstroms). In some embodiments, the distance 710 corresponds to a pixel size. In some embodiments, the trenches 702 comprise at least one of the first trench 702A (shown in FIG. 7A and FIG. 7B), a second trench 702B (shown in FIG. 7A), a third trench 702C (shown in FIG. 7A), or a fourth trench 702D (shown in FIG. 7A). At least one of the first trench 702A is between the first component 202A and the second component 202B, the second trench 702B is between the second component 202B and the fourth component 202 (not shown), the third trench 702C is between the fourth component 202 and the third component 202 (not shown), or the fourth trench 702D is between the third component 202 and the first component 202A. At least one of the first trench 702A is between the first plurality of recesses 502A and the second plurality of recesses 502B, the second trench 702B is between the second plurality of recesses 502B and the fourth plurality of recesses 502D, the third trench 702C is between the fourth plurality of recesses 502D and the third plurality of recesses 502C, or the fourth trench 702D is between the third plurality of recesses 502C and the first plurality of recesses 502A. Other structures and/or configurations of a trench 702 relative to other elements, features, etc. are within the scope of the present disclosure.

In some embodiments, a lowermost portion of a trench 702 is lower than an uppermost portion of a component 202. According to some embodiments, the lowermost portion of the trench 702 is higher than a lowermost portion of the component 202. According to some embodiments, the lowermost portion of the trench 702 is lower than the lowermost portion of the component 202. According to some embodiments, the lowermost portion of the trench 702 is level or coplanar with the lowermost portion of the component 202. Other structures and/or configurations of the trenches 702 relative to the components 202, other elements, features, etc. are within the scope of the present disclosure.

Figure 8:
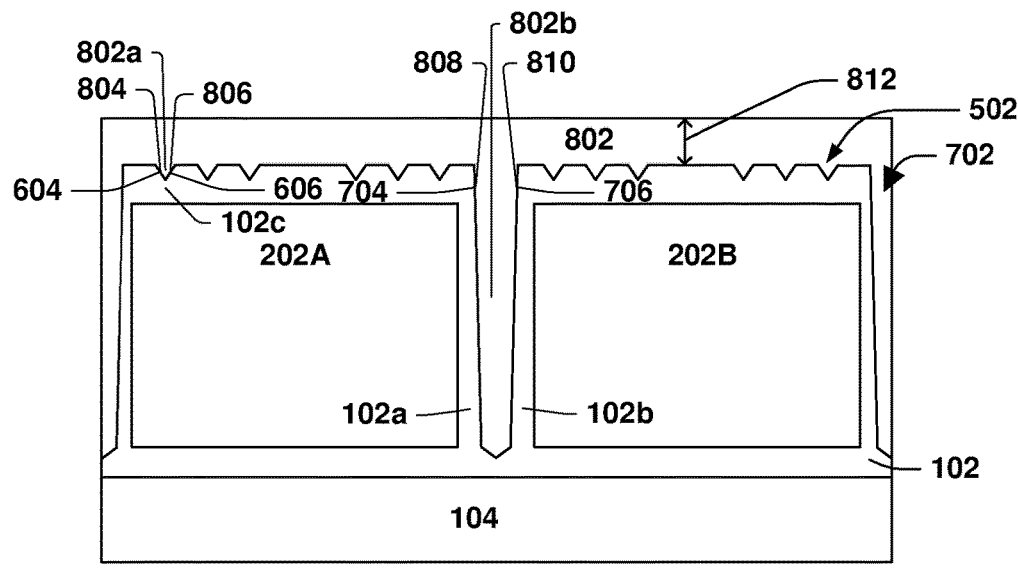
FIGS. 8-11 illustrate cross-sectional views of a semiconductor arrangement at various stages of fabrication, in accordance with some embodiments.

FIG. 8 illustrates a second dielectric layer 802 formed over the substrate 102, according to some embodiments. In some embodiments, the second dielectric layer 802 is in direct contact with the top surface of the substrate 102 and/or sidewalls defined in the substrate 102, such as sidewalls defining the recesses 502 and sidewalls defining the trenches 702. In some embodiments, the second dielectric layer 802 is in indirect contact with the top surface of the substrate 102 and/or sidewalls defined in the substrate 102. Other structures and/or configurations of the second dielectric layer 802 are within the scope of the present disclosure.

In some embodiments, the semiconductor arrangement 100 comprises a buffer layer (not shown) between the substrate 102 and the second dielectric layer 802, such as formed over the substrate 102 prior to forming the second dielectric layer 802. The buffer layer is in direct contact with the top surface of the substrate 102 and/or sidewalls defined in the substrate 102, such as sidewalls defining the recesses 502 and sidewalls defining the trenches 702, or is in indirect contact with the top surface of the substrate 102 and/or sidewalls defined in the substrate 102.

The buffer layer comprises at least one of an anti-reflection coating, $SiO_2$, HfSiON, $HfSiO_x$, $HfAlO_x$, $HfO_2$, $ZrO_2$, $La_2O_3$, $Y_2O_3$, or other suitable material. The buffer layer is formed by at least one of PVD, sputtering, CVD, LPCVD, ALCVD, UHVCVD, RPCVD, ALD, MBE, LPE, spin on, growth, or other suitable techniques. In some embodiments, the buffer layer comprises a single layer that is configured to provide adhesion between the second dielectric layer 802 and the substrate 102. According to some embodiments, the buffer layer comprises multiple layers, where an outer layer of the multiple layers is configured to provide adhesion with the second dielectric layer 802. When the semiconductor arrangement 100 comprises the buffer layer, the second dielectric layer 802 at least one of overlies the buffer layer, is in direct contact with a top surface of the buffer layer, or is in indirect contact with the top surface of the buffer layer. Other structures and/or configurations of the buffer layer are within the scope of the present disclosure.

The second dielectric layer 802 comprises at least one of $Si_3N_4$, $SiO_2$, SiO, MgO, $Al_2O_3$, $Yb_2O_3$, ZnO, $Ta_2O_5$, $ZrO_2$, $HfO_2$, $TeO_2$, $TiO_2$, or other suitable material. The second dielectric layer 802 is formed by at least one of PVD, sputtering, CVD, LPCVD, ALCVD, UHVCVD, RPCVD, ALD, MBE, LPE, spin on, growth, or other suitable techniques. The second dielectric layer 802 is formed at least one of in the recesses 502, in the trenches 702, or over the top surface of the substrate 102. A distance 812 between a top surface of the second dielectric layer 802 and the top surface of the substrate 102 is less than or equal to about 10,000 angstroms (such as less than or equal to about 5,000 angstroms).

A first portion 802a of the second dielectric layer 802 is in a recess 502. The first portion 802a of the second dielectric layer 802 has a third tapered sidewall 804 with which the first tapered sidewall 604 of the substrate 102 aligns. When the semiconductor arrangement 100 comprises the buffer layer over the substrate 102, a portion of the buffer layer separates the third tapered sidewall 804 of the first portion 802a of the second dielectric layer 802 from the first tapered sidewall 604 of the substrate 102.

The first portion 802a of the second dielectric layer 802 has a fourth tapered sidewall 806 with which the second tapered sidewall 606 of the substrate 102 aligns. When the semiconductor arrangement 100 comprises the buffer layer over the substrate 102, a portion of the buffer layer separates the fourth tapered sidewall 806 of the first portion 802a of the second dielectric layer 802 from the second tapered sidewall 606 of the substrate 102. The first portion 802a of the second dielectric layer 802 overlies the first component 202A. At least one of a portion of the buffer layer or a portion 102c of the substrate 102 separates the first portion 802a of the second dielectric layer 802 from the first component 202A.

The first portion 802a of the second dielectric layer 802 in the recess 502 is a HA structure, such as due, at least in part, to at least one of the third tapered sidewall 804, the first tapered sidewall 604, the fourth tapered sidewall 806, or the second tapered sidewall 606. The HA structure directs more radiation to the component 202 underlying the first portion 802a of the second dielectric layer 802 as compared to a portion of the second dielectric layer 802 and a portion of the substrate 102 that do not have one or more tapered sidewalls. One or more additional portions of the second dielectric layer 802 in recesses 502 in the substrate 102 are similarly constructed HA structures that overlie a component 202. Other structures and/or configurations of the HA structures are within the scope of the present disclosure.

A second portion 802b of the second dielectric layer 802 is in a trench 702. The second portion 802b of the second dielectric layer 802 has a third sidewall 808 with which the first sidewall 704 of the substrate 102 aligns. At least some of the third sidewall 808 and at least some of the first sidewall 704 are tapered. When the semiconductor arrangement 100 comprises the buffer layer over the substrate 102, a portion of the buffer layer separates the third sidewall 808 from the first sidewall 704. The second portion 802b of the second dielectric layer 802 has a fourth sidewall 810 with which the second sidewall 706 of the substrate 102 aligns. At least some of the fourth sidewall 810 and at least some of the second sidewall 706 are tapered. When the semiconductor arrangement 100 comprises the buffer layer over the substrate 102, a portion of the buffer layer separates the fourth sidewall 810 from the second sidewall 706.

The second portion 802b of the second dielectric layer 802 is at least one of laterally offset from a component 202 or between two components. A portion of the buffer layer and/or the first portion 102a of the substrate 102 separates the second portion 802b of the second dielectric layer 802 from the first component 202A. A portion of the buffer layer and/or the second portion 102b of the substrate 102 separates the second portion 802b of the second dielectric layer 802 from the second component 202B. In some embodiments, at least some of the second portion 802b of the second dielectric layer 802 is in direct contact with at least some of the first component 202A and/or at least some of the second component 202B.

In some embodiments, the second portion 802b of the second dielectric layer 802 is a DTI structure in the substrate 102. The DTI structure is a BDTI structure or a different type of DTI structure. When the semiconductor arrangement 100 comprises the buffer layer, the DTI structure comprises at least some of the buffer layer. Other structures and/or configurations of the second portion 802b of the second dielectric layer 802 are within the scope of the present disclosure. In some embodiments, given that at least some of the second dielectric layer 802, such as the second portion 802b of the second dielectric layer 802, is in one or more trenches, such as the first trench 702A, the distances 708, 710 (shown in FIG. 7B) discussed with regard to one or more trenches are applicable to at least some of the second dielectric layer 802.

Figure 9:
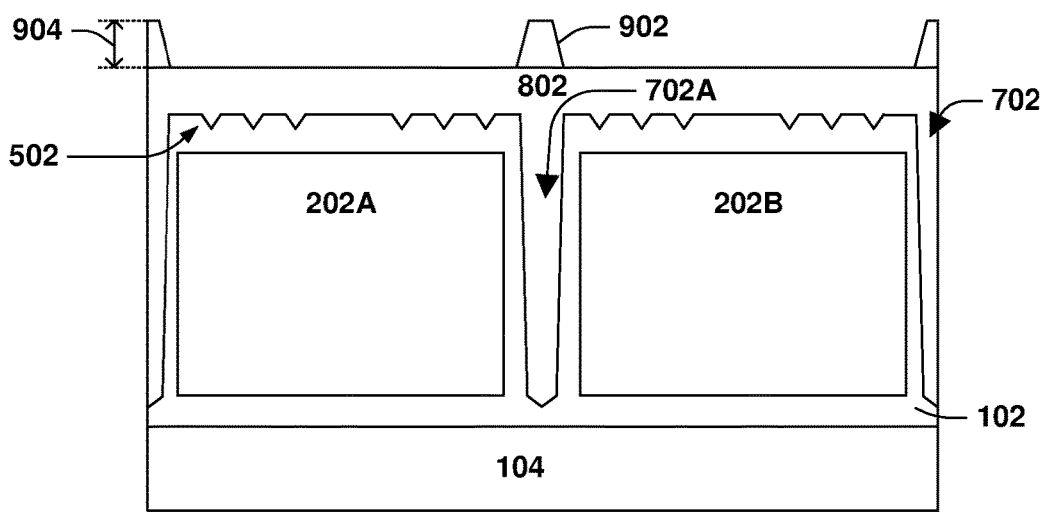

FIG. 9 illustrates grid structures 902 formed over the second dielectric layer 802, according to some embodiments. The grid structures 902 at least one of overlie the second dielectric layer 802, are in direct contact with the top surface of the second dielectric layer 802, or are in indirect contact with the top surface of the second dielectric layer 802. The grid structures 902 are between the components 202, such that the grid structures 902 generally do not overlie or are laterally offset from the components 202. A grid structure 902 is disposed between two adjacent components 202, such that the grid structure 902 overlies a portion of the substrate 102 between the two adjacent components 202. In some embodiments, at least some of the grid structures 902 have a tapered sidewall.

The grid structures 902 comprise at least one of copper, polysilicon, doped polysilicon, aluminum, beryllium, chromium, copper, gold, iron, molybdenum, nickel, platinum, silver, tungsten, boron, antimony, or other suitable material. The grid structures 902 are formed by forming one or more layers of grid structure material over the second dielectric layer 802 and patterning the one or more layers of grid structure material to form the grid structures 902. The one or more layers of grid structure material are formed by at least one of PVD, sputtering, CVD, LPCVD, ALCVD, UHVCVD, RPCVD, ALD, MBE, LPE, spin on, growth, or other suitable techniques. The one or more layers of grid structure material are patterned to form the grid structures 902 by using at least one of a photoresist, a hard mask layer, an etching process, or other suitable techniques. In some embodiments, two adjacent grid structures 902 guide radiation to a component 202 between the two adjacent grid structures 902. A height 904 of a grid structure 902 is less than or equal to about 10,000 angstroms (such as less than or equal to about 5,000 angstroms, or such as about 2,000 angstroms). Other structures and/or configurations of the grid structures 902 are within the scope of the present disclosure.

Figure 10:
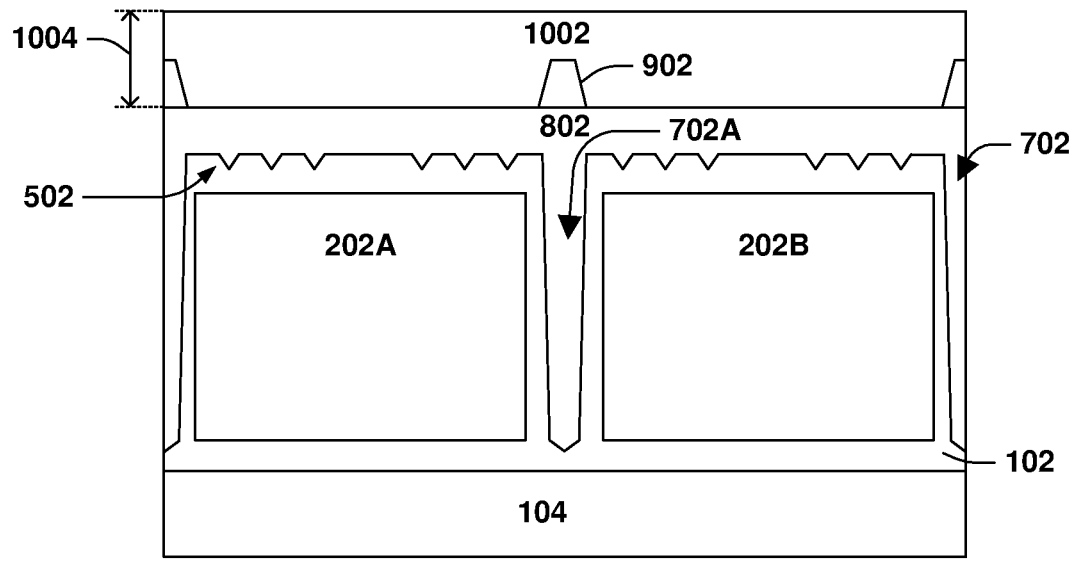

FIG. 10 illustrates a third dielectric layer 1002 formed over at least one of the grid structures 902 or the second dielectric layer 802, according to some embodiments. The third dielectric layer 1002 at least one of overlies the second dielectric layer 802, is in direct contact with the top surface of the second dielectric layer 802, or is in indirect contact with the top surface of the second dielectric layer 802. In some embodiments, the third dielectric layer 1002 is different than the second dielectric layer 802, such as having a different material composition, such that an interface is defined between the third dielectric layer 1002 and the second dielectric layer 802. The third dielectric layer 1002 at least one of overlies the grid structures 902, is in direct contact with sidewalls of the grid structures 902, is in direct contact with top surfaces of the grid structures 902, is in indirect contact with sidewalls of the grid structures 902, or is in indirect contact with top surfaces of the grid structures 902.

The third dielectric layer 1002 comprises at least one of $Si_3N_4$, $SiO_2$, SiO, MgO, $Al_2O_3$, $Yb_2O_3$, ZnO, $Ta_2O_5$, $ZrO_2$, $HfO_2$, $TeO_2$, $TiO_2$, or other suitable material. In some embodiments, the third dielectric layer 1002 comprises a material that is substantially optically transparent to wavelengths of radiation intended to be detected by the components 202, such as NIR wavelengths. The third dielectric layer 1002 is formed by at least one of PVD, sputtering, CVD, LPCVD, ALCVD, UHVCVD, RPCVD, ALD, MBE, LPE, spin on, growth, or other suitable techniques. The third dielectric layer 1002 has a thickness 1004 of less than or equal to about 20,000 angstroms (such as less than or equal to about 10,000 angstroms, or such as less than or equal to about 5,000 angstroms). Other structures and/or configurations of the third dielectric layer 1002 are within the scope of the present disclosure.

Figure 11:
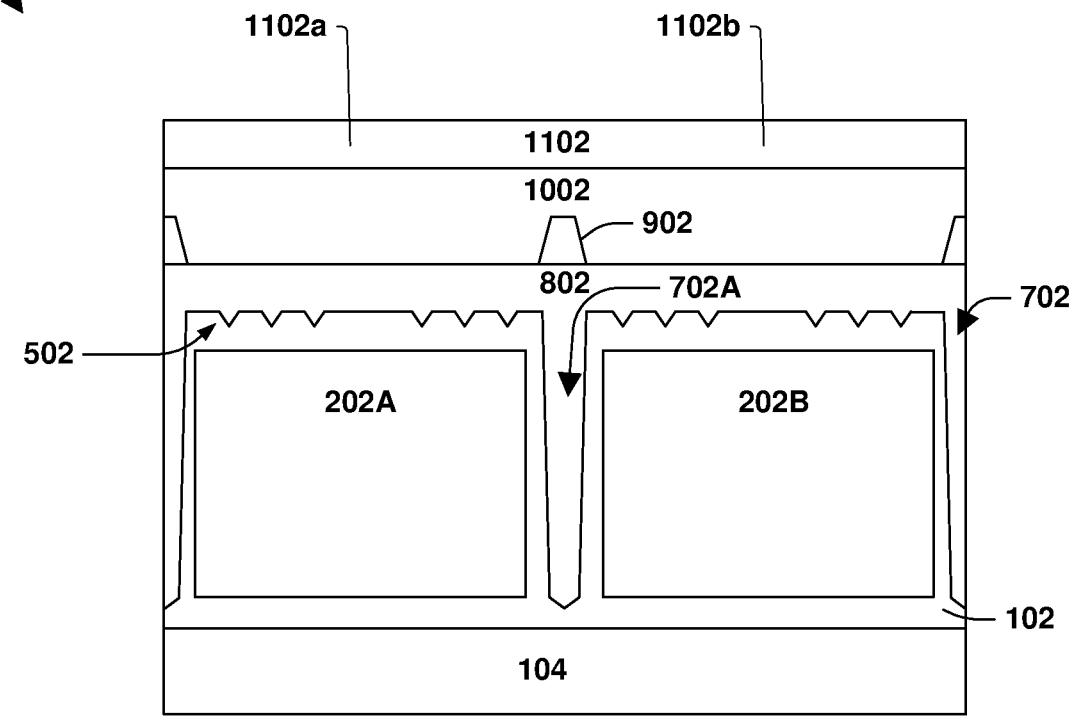

FIG. 11 illustrates one or more color filter layers 1102 formed over the third dielectric layer 1002, according to some embodiments. The one or more color filter layers 1102 at least one of overlie the third dielectric layer 1002, are in direct contact with a top surface of the third dielectric layer 1002, or are in indirect contact with the top surface of the third dielectric layer 1002. The one or more color filter layers 1102 comprise at least one of a pigment-dispersed color resist (PDCR) material, a photosensitive substance, a photoinitiator substance, a multifunctional monomer, one or more additives, a leveling agent, an adhesion promotor, resin, polymer soluble in alkaline solution, color paste, pigment, dispersant, solvent, or other suitable material. The one or more color filter layers 1102 filter certain wavelengths of radiation. In some embodiments, different portions of the one or more color filter layers 1102 have different material compositions to enable different wavelengths to be filtered. A first portion 1102a of the one or more color filter layers 1102 overlying the first component 202A has a first material composition and filters first wavelengths, and a second portion 1102b of the one or more color filter layers 1102 overlying the second component 202B has a second material composition and filters second wavelengths different than the first wavelengths. In some embodiments, the one or more color filter layers 1102 comprises multiple color filter layers on top of each other. In some embodiments, a first color filter layer of the multiple color filter layers corresponds to a red color filter layer configured to filter wavelengths of radiation other than wavelengths of radiation corresponding to red light. In some embodiments, a second color filter layer of the multiple color filter layers corresponds to a blue color filter layer configured to filter wavelengths of radiation other than wavelengths of radiation corresponding to blue light. In some embodiments, the second color filter layer overlies the first color filter layer. In some embodiments, the first color filter layer overlies the second color filter layer. The one or more color filter layers 1102 are formed by at least one of PVD, sputtering, CVD, LPCVD, ALCVD, UHVCVD, RPCVD, ALD, MBE, LPE, spin on, growth, or other suitable techniques. At least one of the one or more color filter layers 1102, such as at least one of the first color filter layer or the second color filter layer, has a thickness of less than or equal to about 10,000 angstroms (such as less than or equal to about 5,000 angstroms). Other structures and/or configurations of the one or more color filter layers 1102 are within the scope of the present disclosure.

Figure 12A:
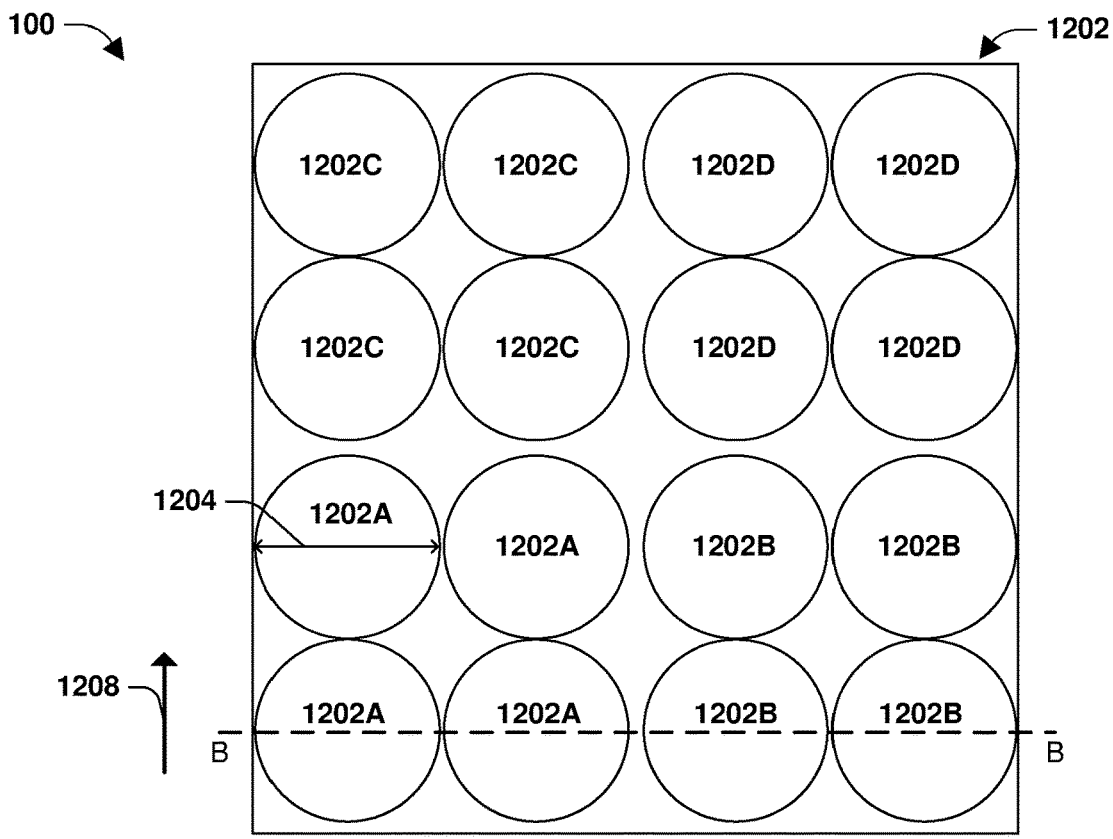
FIG. 12A illustrates a top view of a semiconductor arrangement at a stage of fabrication, in accordance with some embodiments.
Figure 12B:
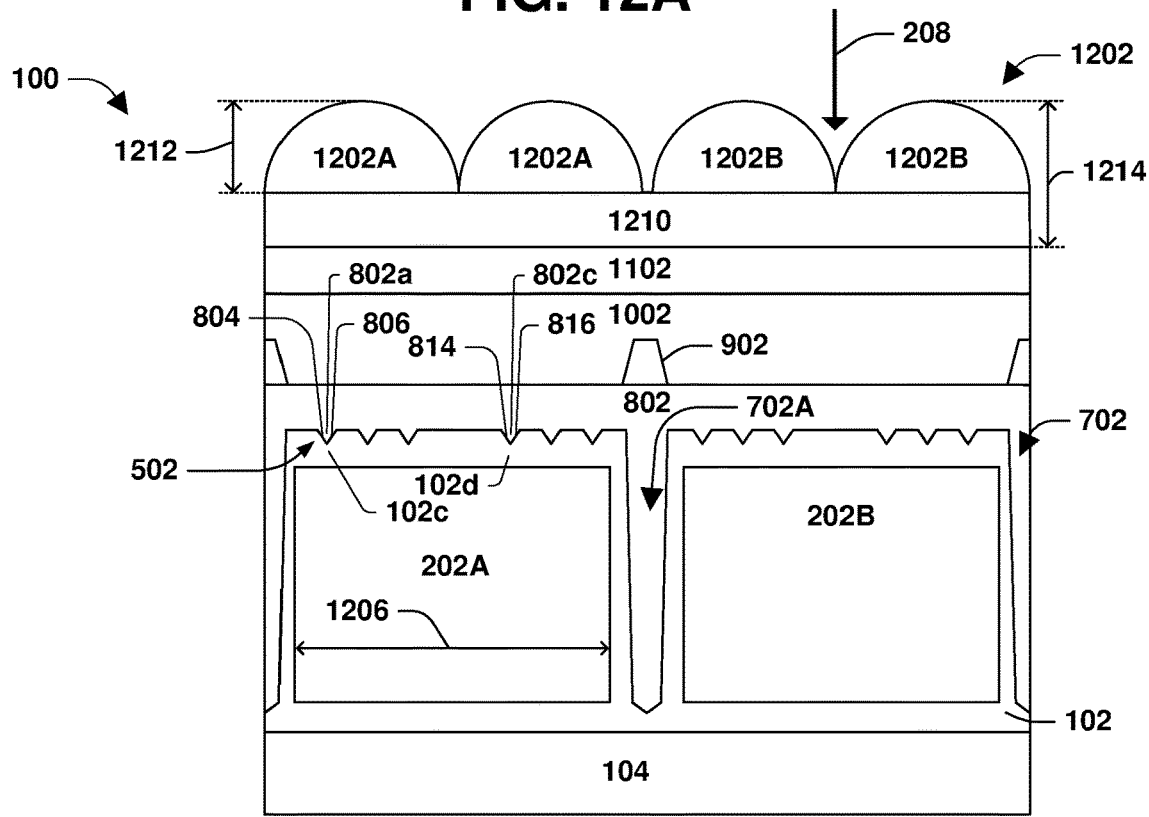
FIG. 12B illustrates a cross-sectional view a semiconductor arrangement taken along line B-B of FIG. 12A, in accordance with some embodiments.

FIGS. 12A and 12B illustrate a lens array 1202 formed over the one or more color filter layers 1102, according to some embodiments. Lenses of the lens array 1202 are at least one of micro-lenses or other suitable lenses. The lens array 1202 comprises at least one of a first plurality of lenses 1202A, a second plurality of lenses 1202B, a third plurality of lenses 1202C, or a fourth plurality of lenses 1202D. The first plurality of lenses 1202A overlies the first component 202A, the second plurality of lenses 1202B overlies the second component 202B, the third plurality of lenses 1202C overlies the third component 202 (not shown), and the fourth plurality of lenses 1202D overlies the fourth component 202 (not shown).

In some embodiments, one or more lenses of the lens array 1202 overlie one or more portions of the second dielectric layer 802 having tapered sidewalls, such as one or more HA structures. A first lens of the first plurality of lenses 1202A overlies at least one of the first portion 802a of the second dielectric layer 802 having the third tapered sidewall 804 and the fourth tapered sidewall 806, or one or more other portions of the second dielectric layer 802 having tapered sidewalls. The first lens of the first plurality of lenses 1202A overlies the portion 102c of the substrate 102 that separates the first portion 802a of the second dielectric layer 802 from the first component 202A. A second lens of the first plurality of lenses 1202A overlies at least one of a third portion 802c of the second dielectric layer 802 having a fifth tapered sidewall 814 and a sixth tapered sidewall 816, or one or more other portions of the second dielectric layer 802 having tapered sidewalls. The second lens of the first plurality of lenses 1202A overlies a portion 102d of the substrate 102 that separates the third portion 802c of the second dielectric layer 802 from the first component 202A.

In some embodiments, the first plurality of lenses 1202A overlies a first plurality of portions of the second dielectric layer 802 formed within the first plurality of recesses 502A (shown in FIG. 6A), the second plurality of lenses 1202B overlies a second plurality of portions of the second dielectric layer 802 formed within the second plurality of recesses 502B (shown in FIG. 6A), the third plurality of lenses 1202C overlies a third plurality of portions of the second dielectric layer 802 formed within the third plurality of recesses 502C (shown in FIG. 6A), and the fourth plurality of lenses 1202D overlies a fourth plurality of portions of the second dielectric layer 802 formed within the fourth plurality of recesses 502D.

In some embodiments, each lens of the first plurality of lenses 1202A overlies a portion of the second dielectric layer 802 within at least one recess of the first plurality of recesses 502A, such as at least one HA structure overlying the first component 202A. In some embodiments, each lens of the second plurality of lenses 1202B overlies a portion of the second dielectric layer 802 within at least one recess of the second plurality of recesses 502B, such as at least one HA structure overlying the second component 202B. In some embodiments, each lens of the third plurality of lenses 1202C overlies a portion of the second dielectric layer 802 within at least one recess of the third plurality of recesses 502C, such as at least one HA structure overlying the third component (not shown). In some embodiments, each lens of the fourth plurality of lenses 1202D overlies a portion of the second dielectric layer 802 within at least one recess of the fourth plurality of recesses 502D, such as at least one HA structure overlying the fourth component (not shown).

A diameter 1204 (shown in FIG. 12A) of a lens of the lens array 1202 is between about 5,000 angstroms to about 60,000 angstroms (such as about 46,200 angstroms). A height 1212 (shown in FIG. 12B) of a lens of the lens array 1202 is between about 2,500 angstroms to about 40,000 angstroms (such as about 23,000 angstroms), such as due to one or more material properties of the lens array 1202. A width 1206 (shown in FIG. 12B) of the first component 202A is at least 20,000 angstroms (such as about 95,000 angstroms). A depth of the first component 202A is at least 20,000 angstroms (such as about 95,000 angstroms). In some embodiments, the depth of the first component 202A is about equal to the width 1206 of the first component 202A. In some embodiments, the depth of the first component 202A is not about equal to the width 1206 of the first component 202A. The depth of the first component 202A corresponds to a length of the first component 202A extending along a direction 1208 (shown in FIG. 12A).

In some embodiments, the lens array 1202 at least one of overlies a lens layer 1210, is in direct contact with a top surface of the lens layer 1210, or is in indirect contact with the top surface of the lens layer 1210. The lens layer 1210 at least one of overlies the one or more color filter layers 1102, is in direct contact with a top surface of the one or more color filter layers 1102, or is in indirect contact with the top surface of the one or more color filter layers 1102. The lens layer 1210 is a lens substrate comprising at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. The lens layer 1210 is formed by at least one of PVD, sputtering, CVD, LPCVD, ALCVD, UHVCVD, RPCVD, ALD, MBE, LPE, spin on, growth, or other suitable techniques. In some embodiments, a distance 1214 (shown in FIG. 12B) between an uppermost portion of a lens of the lens array 1202 and at least one of the top surface of the one or more color filter layers 1102 or a bottom surface of the lens layer 1210 is less than or equal to about 100,000 angstroms (such as less than or equal to about 50,000 angstroms). Other structures and/or configurations of the lens layer 1210 are within the scope of the present disclosure.

When the semiconductor arrangement 100 does not comprise the lens layer 1210, the lens array 1202 is at least one of in direct contact with the top surface of the one or more color filter layers 1102 or in indirect contact with the top surface of the one or more color filter layers 1102. In some embodiments, the lens array 1202 is formed by at least one of thermal reflow, microplastic embossing, microdroplet jetting, photolithography, reactive ion etching, machining, or other suitable methods. Other structures and/or configurations of the lens array 1202 are within the scope of the present disclosure.

In some embodiments, radiation is projected towards the semiconductor arrangement 100, such as at least one of in the direction 208 or in a different direction. At least some of the radiation passes through at least one of the lens array 1202, the lens layer 1210, the one or more color filter layers 1102, the third dielectric layer 1002, the second dielectric layer 802, or some of the substrate 102, and is at least one of sensed, detected, or converted to electrons by the components 202. A lens of the lens array 1202 is configured to at least one of refract the radiation, direct the radiation towards a component 202 underlying the lens, or focus and concentrate the radiation onto the component 202. The semiconductor arrangement 100 having multiple lenses of the lens array 1202 overlying a single component 202 provides for an increase of radiation on a top surface of the single component 202, as compared to other semiconductor arrangements that have merely a single lens overlying a component. The semiconductor arrangement 100 having multiple lenses of the lens array 1202 overlying the single component 202 provides for an increase in uniformity of the radiation on the top surface of the single component 202 (such that a difference between amounts of radiation on different regions of the top surface of the single component 202 is reduced), as compared to other semiconductor arrangements that have merely a single lens overlying a component. In some embodiments, at least one of the increase of the radiation on the top surface of the single component 202 or the increase in the uniformity of the radiation on the top surface of the single component 202 provide for an increase in an amount of radiation that is at least one of sensed, detected or converted by the single component 202.

In some embodiments, radiation at least one of sensed, detected, or converted to electrons by a component 202 is incident upon a plurality of lenses, of the lens array 1202, overlying the component 202. Radiation incident upon a plurality of lenses, of the lens array 1202, overlying a component 202 is directed by the plurality of lenses to the component 202. Radiation at least one of sensed, detected, or converted to electrons by the first component 202A is incident upon the first plurality of lenses 1202A. Radiation incident upon the first plurality of lenses 1202A is directed by the first plurality of lenses 1202A to the first component 202A.

Some semiconductor arrangements have a single lens overlying a photodiode. A size of the single lens is designed to conform with a size of the photodiode such that a diameter of the single lens is about equal to at least one of a width of the photodiode or a depth of the photodiode. When the size of the photodiode exceeds a threshold size, a diameter of the single lens exceeds a threshold diameter to conform to the size of the photodiode. A height of a lens, such as at least one of the single lens or a lens of the lens array 1202, is limited by a maximum height, such as due to at least one of one or more material properties of the lens or one or more process limitations of one or more processes used for forming the lens. In some embodiments, the maximum height is between about 20,000 angstroms to about 40,000 angstroms (such as about 30,000 angstroms, or such as about 23,000 angstroms). Due to a height of the single lens being limited by the maximum height, if the diameter of the single lens exceeds the threshold diameter, the single lens has a shape different than a half spherical shape, such as a half-spheroidal shape or a flattened half-sphere. In some embodiments, the threshold diameter is about twice the maximum height. Other values of the threshold diameter are within the scope of the present disclosure.

By implementing the semiconductor arrangement 100 having multiple lenses of the lens array 1202 overlying a single component 202, a lens of the lens array 1202 is formed such that at least one of a diameter 1204 of the lens does not exceed the threshold diameter or the lens has a half spherical shape, even where a size of the single component 202 exceeds the threshold size. The size of the single component 202 exceeding the threshold size provides for an increase in a full well capacity (FWC) of the single component 202 as compared to other components having sizes that do not exceed the threshold size. In some embodiments, at least some of the components 202 have sizes exceeding the threshold size. In some embodiments, the threshold size corresponds to at least one of a threshold width or a threshold depth. In some embodiments, the threshold width is between about 30,000 angstroms to about 70,000 angstroms (such as about 50,000 angstroms). In some embodiments, the threshold depth is between about 30,000 angstroms to about 70,000 angstroms (such as about 50,000 angstroms). Other structures and/or configurations of the components 202, such as the components 202 having sizes that do not exceed the threshold size, are within the scope of the present disclosure.

In some embodiments, the lens array 1202 is formed such that each lens of the lens array 1202 at least one of has a half spherical shape or has a diameter 1204 that does not exceed the threshold diameter. The lens array 1202 having multiple lenses overlying a single component 202 provides for an increase in radiation that is at least one of refracted by the multiple lenses, directed to the single component 202 by the multiple lenses, focused and concentrated by the multiple lenses onto the single component 202, sensed by the single component 202, detected by the single component 202, or converted to electrons by the single component 202, as compared to other semiconductor arrangements that have merely a single lens overlying a component. In some embodiments, the increase is due to at least some of the multiple lenses having diameters that do not exceed the threshold diameter and/or at least some of the multiple lenses having a half spherical shape.

HA structures, such as portions of the second dielectric layer 802 in the recesses 502 overlying the components 202, provide for an increase in an amount of radiation that is at least one of sensed, detected or converted by the components 202, as compared to other sensors that do not implement the HA structures. Implementing the HA structures mitigates reflection or deflection by the substrate 102 of radiation, projected towards a component 202, away from the component 202. In some embodiments, the radiation comprises NIR radiation, such as radiation with a wavelength between about 700 nanometers to about 2500 nanometers. Other wavelengths of radiation directed to the components 202 by the HA structures are within the scope of the present disclosure.

In some embodiments, DTI structures, such as portions of the second dielectric layer 802 in the trenches 702 between the components 202, at least one of prevent or mitigate crosstalk between components 202. The DTI structures at least one of prevent or mitigate radiation from traveling from one component 202 to an adjacent component 202, or simply away from one component 202 when there is no adjacent the component 202. Radiation traveling away from the component 202 is reflected by a DTI structure back towards the component 202. Generally, much more radiation is detected by a component 202 when the radiation is redirected back towards the component 202.

In some embodiments, at least one of multiple lenses overlying a single component 202, the HA structures, or the DTI structures provide for an increase in at least one of a MTF or a spatial frequency response of the sensor as compared to other sensors that do not implement at least one of the multiple lenses over the single component 202, the HA structures, or the DTI structures. The increase in at least one of the MTF or the spatial frequency response is due, at least in part, to radiation being refracted, concentrated, focused, channeled, directed, reflected, etc. toward a component, such as a photodiode. In some embodiments, at least one of multiple lenses overlying a single component 202, the HA structures, or the DTI structures provide for an improvement in resolution as compared to other sensors that do not implement at least one of the multiple lenses over the single component 202, the HA structures, or the DTI structures. The improvement in resolution is due, at least in part, to radiation being refracted, concentrated, focused, channeled, directed, reflected, etc. toward a component, such as a photodiode. In some embodiments, at least one of multiple lenses overlying a single component 202, the HA structures, or the DTI structures provide for an improved QE of a sensor implemented via the semiconductor arrangement 100 as compared to other sensors that do not implement at least one of multiple lenses overlying a single component 202, the HA structures, or the DTI structures. Accordingly, at least one of multiple lenses overlying a single component 202, the HA structures, or the DTI structures provide for an increase in radiation, such as NIR radiation, being sensed, detected, converted to electrons, etc.

In some embodiments, a semiconductor arrangement is provided. The semiconductor arrangement includes a first photodiode in a substrate. The semiconductor arrangement includes a lens array over the substrate. A first plurality of lenses of the lens array overlies the first photodiode. Radiation incident upon the first plurality of lenses is directed by the first plurality of lenses to the first photodiode.

In some embodiments, a semiconductor arrangement is provided. The semiconductor arrangement includes a first component in a substrate. The semiconductor arrangement includes a first dielectric layer over the substrate. A first portion of the first dielectric layer overlies the first component. The first portion of the first dielectric layer has a tapered sidewall. A first portion of the substrate separates the first portion of the first dielectric layer from the first component. A second portion of the first dielectric layer overlies the first component. The second portion of the first dielectric layer has a tapered sidewall. A second portion of the substrate separates the second portion of the first dielectric layer from the first component. The semiconductor arrangement includes a lens array over the first dielectric layer. A first lens of the lens array overlies the first portion of the first dielectric layer and the first portion of the substrate. A second lens of the lens array overlies the second portion of the first dielectric layer and the second portion of the substrate.

In some embodiments, a method for forming a semiconductor arrangement is provided. The method includes forming a first recess in a substrate, wherein the first recess overlies a first photodiode in the substrate. The method includes forming a second recess in the substrate, wherein the second recess overlies the first photodiode in the substrate. The method includes forming a first dielectric structure in the first recess. The method includes forming a second dielectric structure in the second recess. The method includes forming a first lens over the first dielectric structure. The method includes forming a second lens over the second dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first photodiode in a substrate;
   a grid structure over the first photodiode;
   a first dielectric layer over the grid structure;
   a color filter layer over the first dielectric layer, wherein the first dielectric layer separates the color filter layer from the first photodiode; and
   a lens array over the color filter layer, wherein:
      a first plurality of lenses of the lens array overlies the first photodiode such that a vertical projection of each of the first plurality of lenses intersects the first photodiode, wherein:
         the first plurality of lenses comprises a first lens and a second lens,
         a first plurality of recesses are defined in a top surface of a first portion of the substrate underlying the first lens and overlying the first photodiode such that a vertical projection of each of the first plurality of recesses intersects the first photodiode;

a second plurality of recesses are defined in a top surface of a second portion of the substrate underlying the second lens and overlying the first photodiode such that a vertical projection of each of the second plurality of recesses intersects the first photodiode; and a top surface of a third portion of the substrate between the first plurality of recesses and the second plurality of recesses and underlying where the first lens abuts the second lens is planar; and radiation incident upon the first plurality of lenses is directed by the first plurality of lenses to the first photodiode.

2. The semiconductor arrangement of claim 1, comprising:
a second dielectric layer, wherein a first portion of the second dielectric layer is laterally offset from the first photodiode.

3. The semiconductor arrangement of claim 2, comprising:
a second photodiode in the substrate, wherein:
the first portion of the second dielectric layer is laterally offset from the second photodiode; and
the first portion of the second dielectric layer is between the first photodiode and the second photodiode.

4. The semiconductor arrangement of claim 3, wherein:
a second plurality of lenses of the lens array overlies the second photodiode.

5. The semiconductor arrangement of claim 1, comprising:
a second dielectric layer, wherein:
a first portion of the second dielectric layer overlies the first photodiode;
the first portion of the second dielectric layer has a tapered sidewall; and
the first portion of the substrate separates the first portion of the second dielectric layer from the first photodiode.

6. The semiconductor arrangement of claim 5, wherein:
a first recess of the first plurality of recesses is defined by a first tapered sidewall of the first portion of the substrate with which the tapered sidewall of the first portion of the second dielectric layer aligns.

7. The semiconductor arrangement of claim 6, wherein:
a second portion of the second dielectric layer overlies the first photodiode;
the second portion of the second dielectric layer has a tapered sidewall; and
the first recess is defined by a second tapered sidewall of the first portion of the substrate with which the tapered sidewall of the second portion of the second dielectric layer aligns.

8. The semiconductor arrangement of claim 7, wherein:
the first tapered sidewall of the first portion of the substrate has a first slope;
the second tapered sidewall of the first portion of the substrate has a second slope;
the second slope is opposite in polarity relative to the first slope; and
the second dielectric layer completely fills, from a top of the first tapered sidewall to a bottom of the first tapered sidewall, a region between the first tapered sidewall and the second tapered sidewall.

9. The semiconductor arrangement of claim 5, wherein:
a second portion of the second dielectric layer overlies the first photodiode;
the second portion of the second dielectric layer has a tapered sidewall;
the second portion of the substrate separates the second portion of the second dielectric layer from the first photodiode;
the first lens of the first plurality of lenses overlies the first portion of the second dielectric layer and the first portion of the substrate; and
the second lens of the first plurality of lenses overlies the second portion of the second dielectric layer and the second portion of the substrate.

10. A semiconductor arrangement, comprising:
a first component in a substrate, wherein the substrate surrounds the first component such that the substrate overlies and underlies the first component such that a vertical projection of the first component intersects a first portion of the substrate above the first component and a second portion of the substrate below the first component;
a first dielectric layer over the substrate;
a first plurality of recesses are defined in a top surface of the first portion of the substrate underlying the first lens and overlying the first component such that a vertical projection of each of the first plurality of recesses intersects the first component;
a second plurality of recesses are defined in a top surface of a third portion of the substrate underlying the second lens and overlying the first component such that a vertical projection of each of the second plurality of recesses intersects the first component; and
a top surface of a fourth portion of the substrate between the first plurality of recesses and the second plurality of recesses and underlying where the first lens abuts the second lens is planar.

11. The semiconductor arrangement of claim 10, wherein:
the first portion of the substrate has a first tapered sidewall defining a first recess of the first plurality of recesses and with which a first tapered sidewall of the first dielectric layer aligns.

12. The semiconductor arrangement of claim 11, wherein:
the first portion of the substrate has a second tapered sidewall defining the first recess and with which a second tapered sidewall of the first dielectric layer aligns.

13. The semiconductor arrangement of claim 12, wherein:
the first tapered sidewall of the first portion of the substrate has a first slope;
the second tapered sidewall of the first portion of the substrate has a second slope; and
the second slope is opposite in polarity relative to the first slope.

14. The semiconductor arrangement of claim 10, wherein:
a first portion of the first dielectric layer is laterally offset from the first component.

15. The semiconductor arrangement of claim 14, comprising:
a second component in the substrate, wherein:
the first portion of the first dielectric layer is laterally offset from the second component; and
the first portion of the first dielectric layer is between the first component and the second component.

16. The semiconductor arrangement of claim 15, wherein:
a third lens of the lens array and a fourth lens of the lens array overlie the second component.

17. The semiconductor arrangement of claim 10, wherein:
the first component is a photodiode.

18. A semiconductor arrangement, comprising:
a first photodiode in a substrate;
a first lens overlying the first photodiode;
a second lens overlying the first photodiode, wherein:
- a first plurality of recesses are defined in a top surface of a first portion of the substrate underlying the first lens and overlying the first photodiode such that a vertical projection of each of the first plurality of recesses intersects the first photodiode;
- a second plurality of recesses are defined in a top surface of a second portion of the substrate underlying the second lens and overlying the first photodiode such that a vertical projection of each of the second plurality of recesses intersects the first photodiode; and
- a top surface of a third portion of the substrate between the first plurality of recesses and the second plurality of recesses and underlying where the first lens abuts the second lens is planar.

19. The semiconductor arrangement of claim 18, comprising:
a second photodiode in the substrate; and
a third lens overlying the second photodiode, wherein a trench is defined in the substrate between the first photodiode and the second photodiode.

20. The semiconductor arrangement of claim 19, wherein a grid structure overlies the trench.

* * * * *